United States Patent [19]

Thomas et al.

[11] Patent Number: 5,087,927
[45] Date of Patent: Feb. 11, 1992

[54] ON-AXIS AIR GAGE FOCUS SYSTEM

[75] Inventors: Tim Thomas, Beaverton; Eric Christenson, Portland; Bob Holstrom, Portland; Eugene Mino, Jr., Portland, all of Oreg.

[73] Assignee: Ateo Corporation, Beaverton, Oreg.

[21] Appl. No.: 472,894

[22] Filed: Jan. 31, 1990

[51] Int. Cl.⁵ .......................... G01D 9/42; G01M 3/02
[52] U.S. Cl. ........................................ 346/108; 73/375
[58] Field of Search ............... 346/108, 107 R, 139 R; 73/37.5

[56] References Cited

U.S. PATENT DOCUMENTS

| 3,903,735 | 9/1975 | Wilson | 73/105 |
| 4,142,401 | 3/1979 | Wilson | 73/37.5 |
| 4,796,038 | 1/1989 | Allen et al. | 346/108 |
| 4,801,352 | 1/1989 | Piwczyk | 156/643 |

OTHER PUBLICATIONS

Silicon Processing for the VLSI Era. vol. 1, Process Technology, Stanley Wolf and Richard N. Tauber, Lattice Press, 1987, pp. 493-505.

Primary Examiner—Mark J. Reinhart
Attorney, Agent, or Firm—Blakely, Sokoloff, Taylor & Zafman

[57] ABSTRACT

A lithography tool having an improved focus system. The focus system comprises a lens mounted in a nosepiece which defines a chamber. The chamber defines an orifice through which the lens system may see a workpiece. An air supply is provided to supply a regulated and measured air flow to the chamber. By measuring the air flow into the chamber, the rate of air flow through the orifice may be determined. The rate of air flow through the orifice is proportional to the gap between the orifice and a workpiece.

21 Claims, 9 Drawing Sheets

ON-AXIS AIR GAGE FOCUS SYSTEM

BACKGROUND OF THE INVENTION

1. Field of the Invention

The present invention relates to measurement systems for measuring the width of a gap such as may be useful in focusing systems for a scanned laser lithography system or the like.

2. Description of the Related Art

The present invention relates to an apparatus for measurement of small gaps. The described device has particular application in photolithography systems for semiconductor production where a gap may exist between a work piece and an optical lens system or the like. It should be noted that the present invention has application in other fields than semiconductor processing. For example, the apparatus of the present invention may be useful in measurement of gaps between a lens system of microscope and a target work surface. In the photolithography field a number of devices for measurement of gaps are known.

A first known measurement device is described with reference to FIG. 1. The system may be described as a grazing incident optical technique apparatus in which a light source 104 is utilized to direct a light beam at work surface 102. The beam is directed at a point on the work surface beneath the optical path of a stepper lens assembly 101. The light beam is reflected to a light detector 103 and the total length of the light beam path may be determined. A calculation of the gap between the stepper lens assembly 101 and the work surface 102 may be completed based on the calculation of the length of the light beam path. Thus, this system allows measurement of the gaps between the work surface 102 and the stepper lens 101 over the same area as is targeted for printing. As will be seen, the feature of measurement of the gap over the same area as is targeted for printing is an important aspect of the present invention. However, this described prior art system illustrated by FIG. 1 may not work on all surfaces. For example, this system may not work on a surface which is not adequately reflective.

A second prior art system for measurement of gaps is illustrated with reference to FIG. 2. In FIG. 2, a capacitance gage 204 is provided to measure the capacitance level between the gage 204 and work surface 202. The distance between stepper lens 201 and work surface 202 may then be calculated based on this capacitance level. However, as can be seen with reference to FIG. 7, a typical work surface 702 may not have a uniform surface. Therefore, any measurement means, such as measurement means 721 located to measure the gap between such measurement means 721 and the work surface 702, may result in an incorrect measurement if the distance measured is not the distance directly below the lens 701.

FIG. 3 illustrates a variation of the system of FIG. 2 in which air gage jets 304 are located off the axis of stepper lens 301 to measure the gap between the air gage jets 304 and 305 and the work surface 302. This type of system relates to the preferred embodiment of the present invention in its use of air gage jets which are utilized to measure the back pressure produced resistance from work surface 302; however, the system does not allow for measurement directly over the work surface which is targeted for printing and, therefore, is subject to the short comings illustrated by FIG. 7.

It is therefore an object of the present invention to develop a measurement means for measuring a gap between a work surface and a targeting device in which the measurement is taken over the surface which is targeted.

It is further an objective of the present invention to develop such a measurements means which is capable of working in conjunction with virtually any surface including both reflective or non-reflective surfaces.

The preferred embodiment of the present invention utilizes an air gage as a measurement means. A number of such gages are known in the art. One such gage is described by U.S. Pat. No. 4,142,401 Wilson. This reference describes a gage for measuring a width of a gap. The type of gage described by Wilson may be utilized for example in the measurement system of FIG. 3. As can be appreciated from a review of Wilson, this gage allows measurement with use of relatively low pressurization.

SUMMARY OF THE INVENTION

An air-gage focus system is described in which measurement of a gap between a lens system and a workpiece may be measured. In the system of the preferred embodiment, a chamber at the final image plane of the lens system of a semiconductor lithography tool or the like is pressurized with a gas (such as air). The system allows focus of the lens system by measurement of the distance between the lens and the workpiece. The chamber defines a measurement orifice through which the lens system "sees" or is focused.

In the preferred system, air flow from an air supply coupled with the orifice is measured. The air flow is a function of the distance between the workpiece and measurement orifice. The airflow is measured by electronics and the measurement information is supplied to a focus control system. The result is focus control measured at the optical focus of the lens.

As is understood by one of ordinary skill in the art, certain variations are available to the preferred embodiment of the present invention. For example, a system may be designed to measure back pressure rather than air flow.

The present invention may be briefly described as a lens focus system for focusing an energy beam on a surface comprising a chamber for holding a lens, the chamber defining an orifice located in a path between the lens and a workpiece; supply means for supplying a fluid to said chamber; and measurement means for measuring fluid flow from said supply means to said chamber.

DETAILED DESCRIPTION OF THE PREFERRED EMBODIMENT

An air gage focus system for a scanned laser lithography tool is described. In the following description, numerous specific details are set forth such as specific circuits, layouts of lenses, etc., in order to provide a thorough understanding of the present invention. It will be obvious, however, to one skilled in the art that the present invention may be practiced without these specific details. In other instances, well-known circuits, structures and techniques have not been shown in detail in order not to unnecessarily obscure the present invention.

OVERVIEW OF THE LITHOGRAPHY SYSTEM OF THE PRESENT INVENTION

In the present invention, a writing means is utilized to project an energy beam through a reduction lens 101 onto a work surface 102, such as a semiconductor wafer. The writing means may be of any of a number of conventional design and typically will supply a plurality of beams to the workpiece surface for scanning a scan area, for example in a raster scan technique. In such as system, it is necessary to determine the distance between the reduction lens 101 and the work surface 102 in order to provide for proper focus of the energy beam onto the work piece.

An example of a laser system utilizing such a energy beam is described with reference to U.S. Pat. No. 4,796,038 titled Laser Pattern Generation Apparatus filed Mar. 28, 1988, issued Jan. 3, 1989 (the '038 reference) which is a continuation of Ser. No. 867,205 filed May 27, 1986, now abandoned, which is a continuation of Ser. No. 758,344, filed July 24, 1985, now abandoned, each of which are assigned to the assignee of the present invention. The '038 reference describes a system having particular application in the generation of masks for semiconductor production. However, the '038 reference does teach a system comprising a radiant energy system, namely a laser, supplying a radiant energy beam to a beam splitter which is provided through a series of lenses, mirrors and modulators to a reduction lens and a workpiece. Therefore, the teachings of the '038 reference are incorporated here by reference.

The present invention further relates to U.S patent application Ser. No. 07/472,787, titled Scanning Laser Lithography System Alignment Apparatus, filed concurrently herewith and assigned to the assignee of the present invention, which application is incorporated here by reference.

Other references teach direct-write radiant energy source systems for semiconductor production. For example, S. Wolf and R. N. Tauber, *Silicon Processing for the VLSI Era. Volume 1, Process Technology*, Lattice Press, 1986 (reprinted with corrections, 1987), pp. 493–504, (The Wolf reference) teaches systems using focused electron beams for forming circuit patterns on semiconductor wafers. The Wolf reference is also incorporated here by reference.

Figure 9:
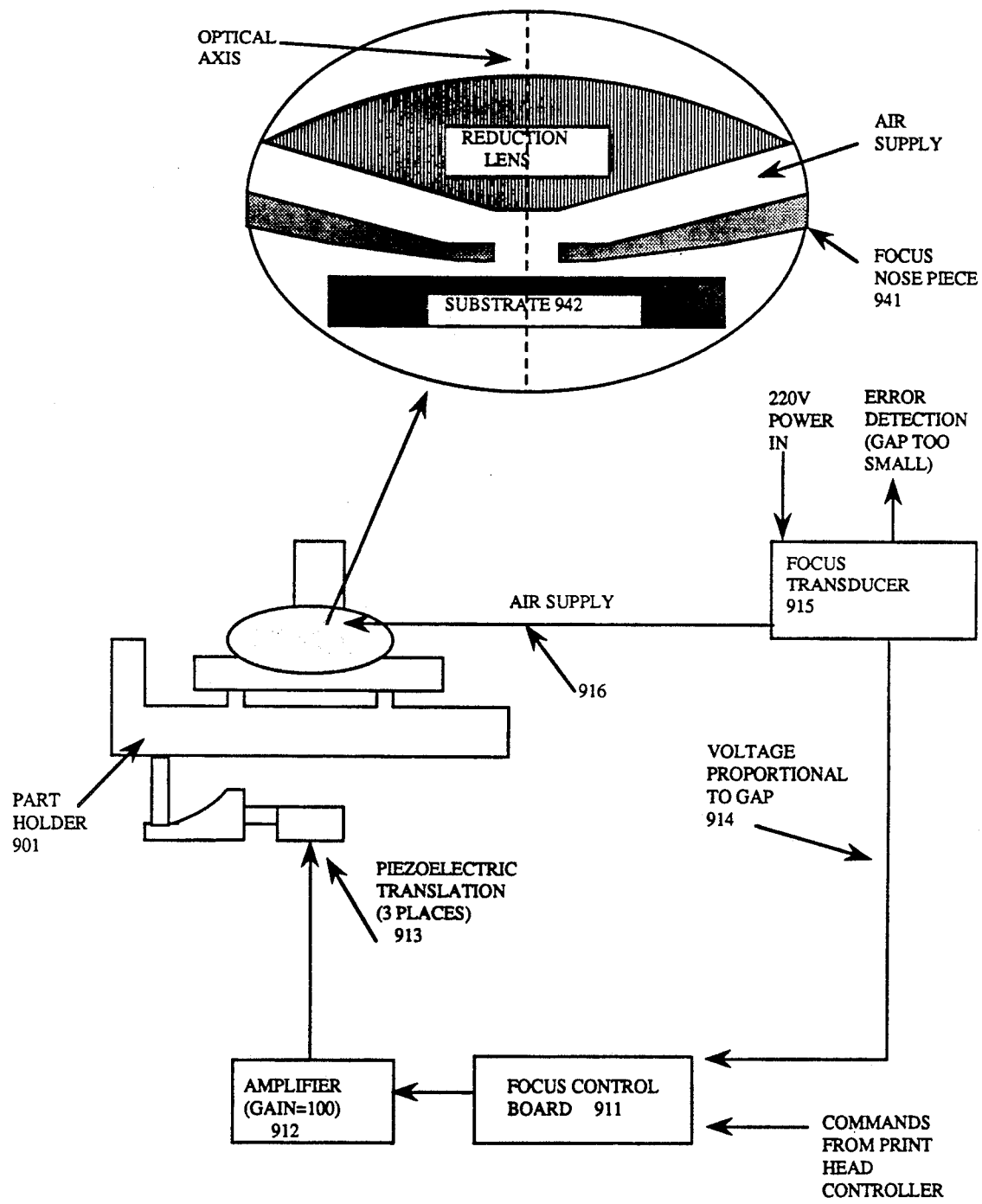
FIG. 9 is a block diagram illustrating a focus system as may be utilized by the present invention.

FIG. 9 is a block diagram of the air gage focus system of the preferred embodiment. The position of the workpiece relative to an energy beam delivered through 20× reduction lens 902 is controlled by commands from a print head controller (not shown). The commands from the print head controller are delivered to a focus control board 911 which is coupled to amplifier 912 to control three piezoelectric position translators 913. Focus control board 911 is further coupled to receive information on a gap between a focus nosepiece 941 of the lithography system and the workpiece substrate 942. In particular, voltage proportional to the gap is carried on line 1014 from focus transducer 915.

Focus transducer 915 is provided, as will be seen, to measure the gas flow rate in air supply 916. As will be seen, the gas flow rate is utilized to determine the width of the gap between focus nosepiece 941 and substrate 942.

In general, the preferred embodiment of the present invention is designed to achieve the following objectives:

(1) The distance between the objective lens and the surface of the substrate to be written to is kept substantially constant;
(2) an analog signal is provided which varies linearly with the gap between the objective lens and the substrate surface;
(3) an error condition is reported if the gap between the objective lens and the substrate surface is less than 10 microns; and
(4) the gap is controlled with a tolerance of ±0.3 microns.

DESCRIPTION OF THE NOSE PIECE OF THE PREFERRED EMBODIMENT

Figure 1:
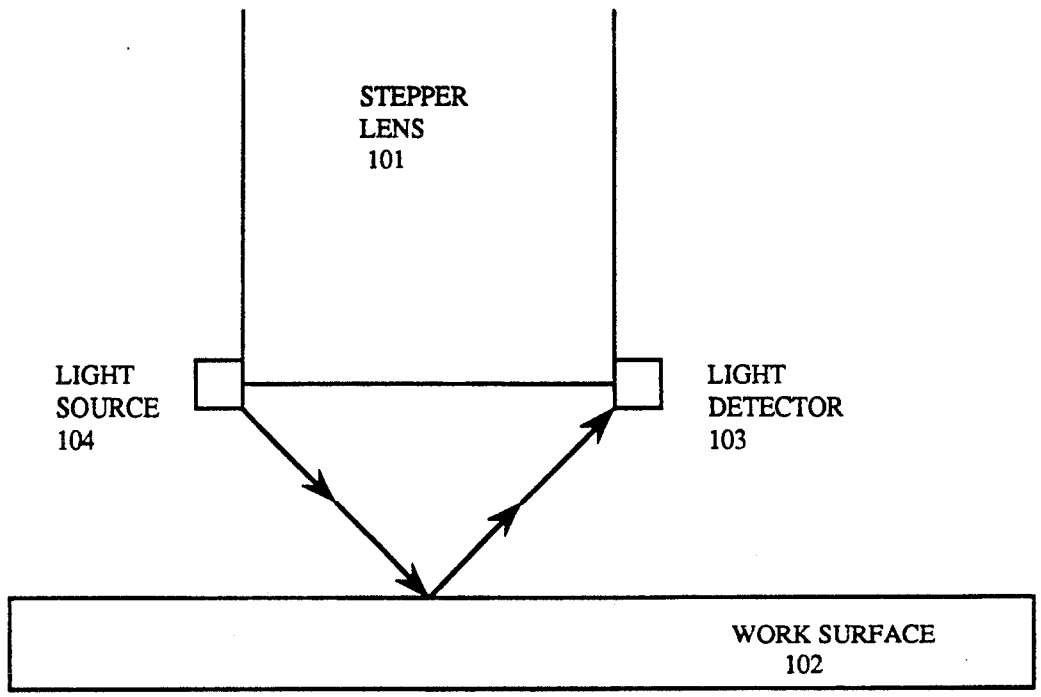
FIG. 1 is an illustration of a prior art measurement device.
Figure 2:
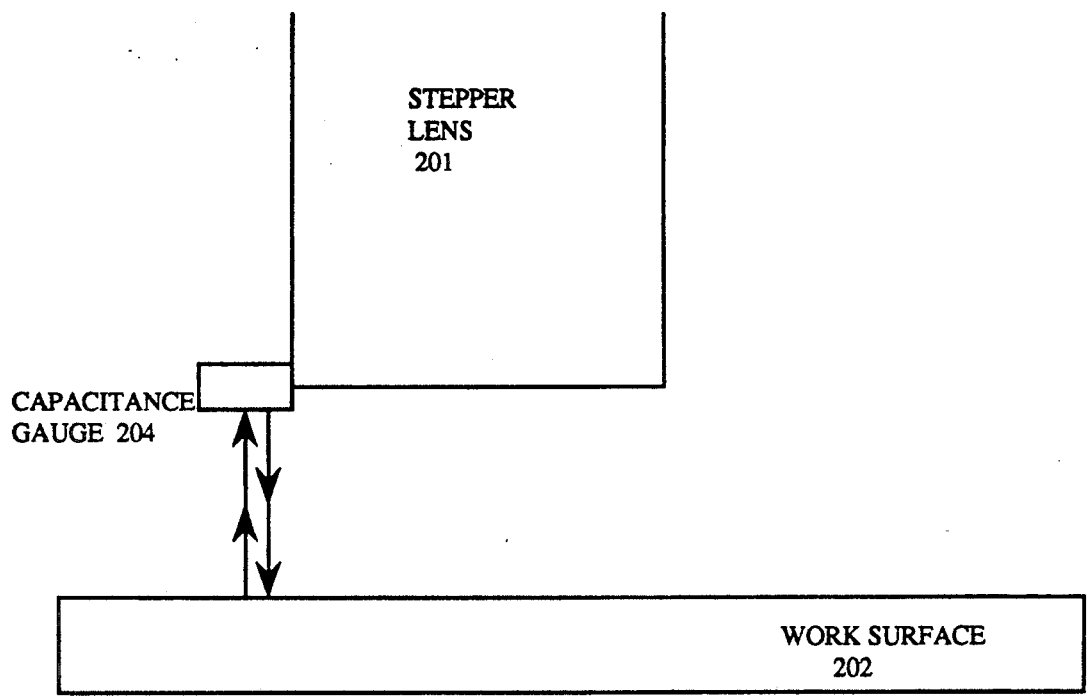
FIG. 2 is an illustration of a second prior art measurement device.
Figure 3:
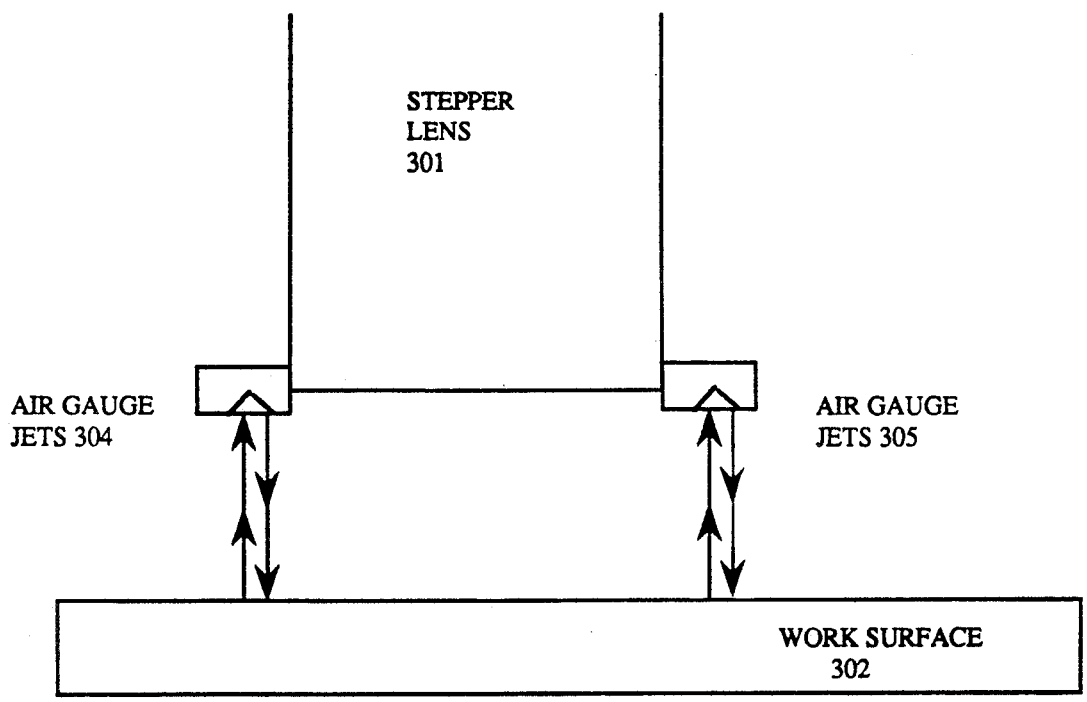
FIG. 3 is an illustration of a third prior art measurement device.
Figure 4:
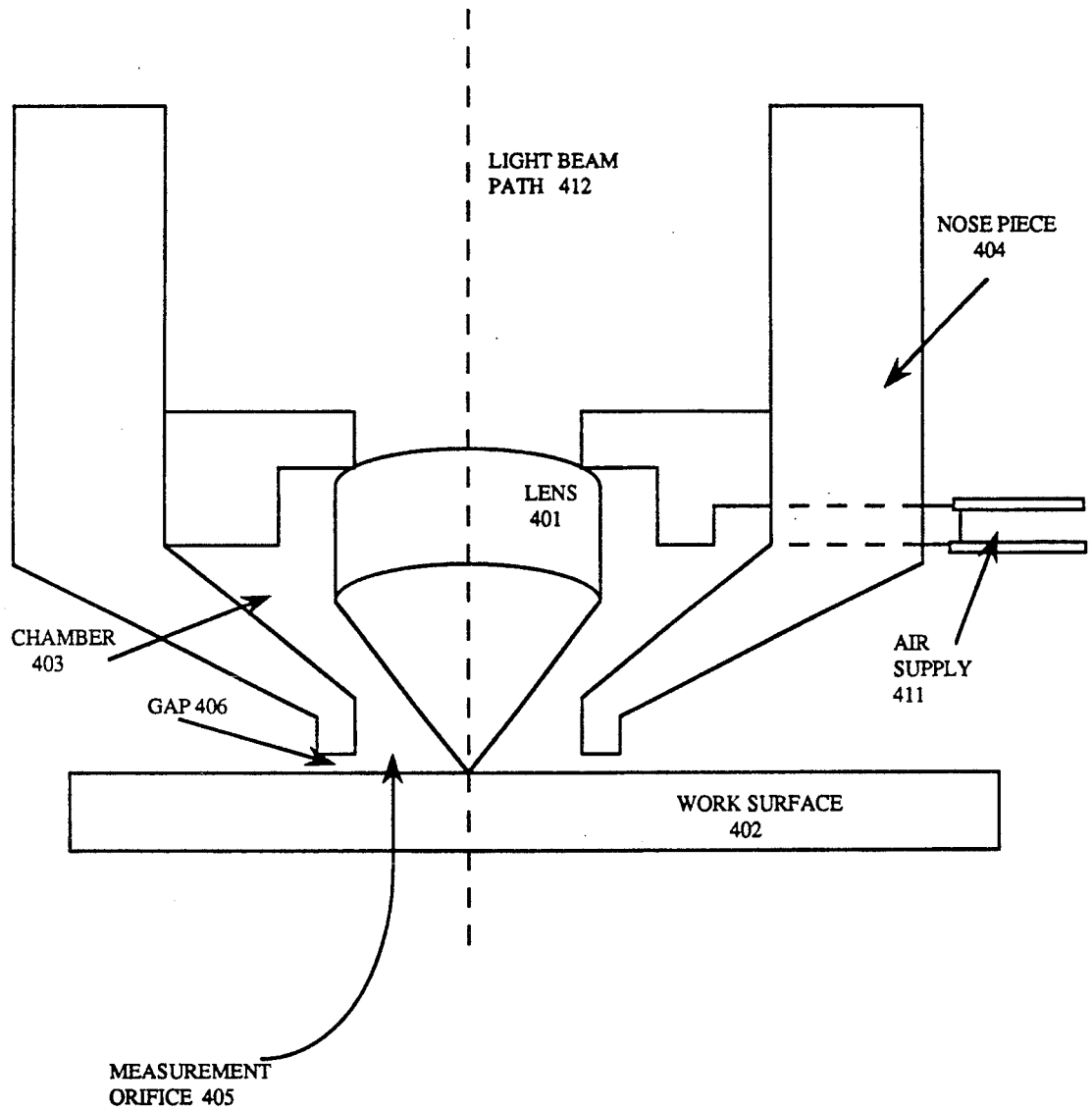
FIG. 4 is a cut-away view of a measurement orifice of a measurement device of the present invention.
Figure 5:
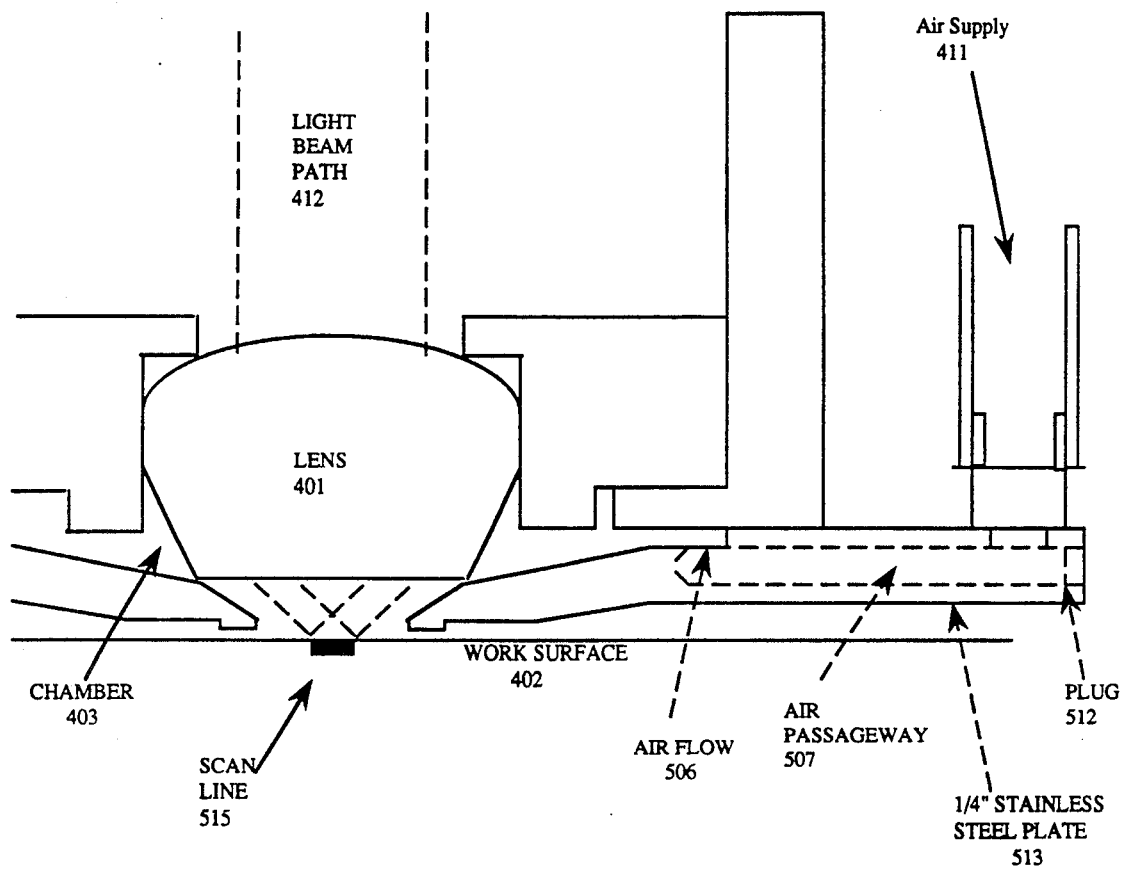
FIG. 5 is a more detailed view of the measurement orifice of the present invention.
Figure 6:
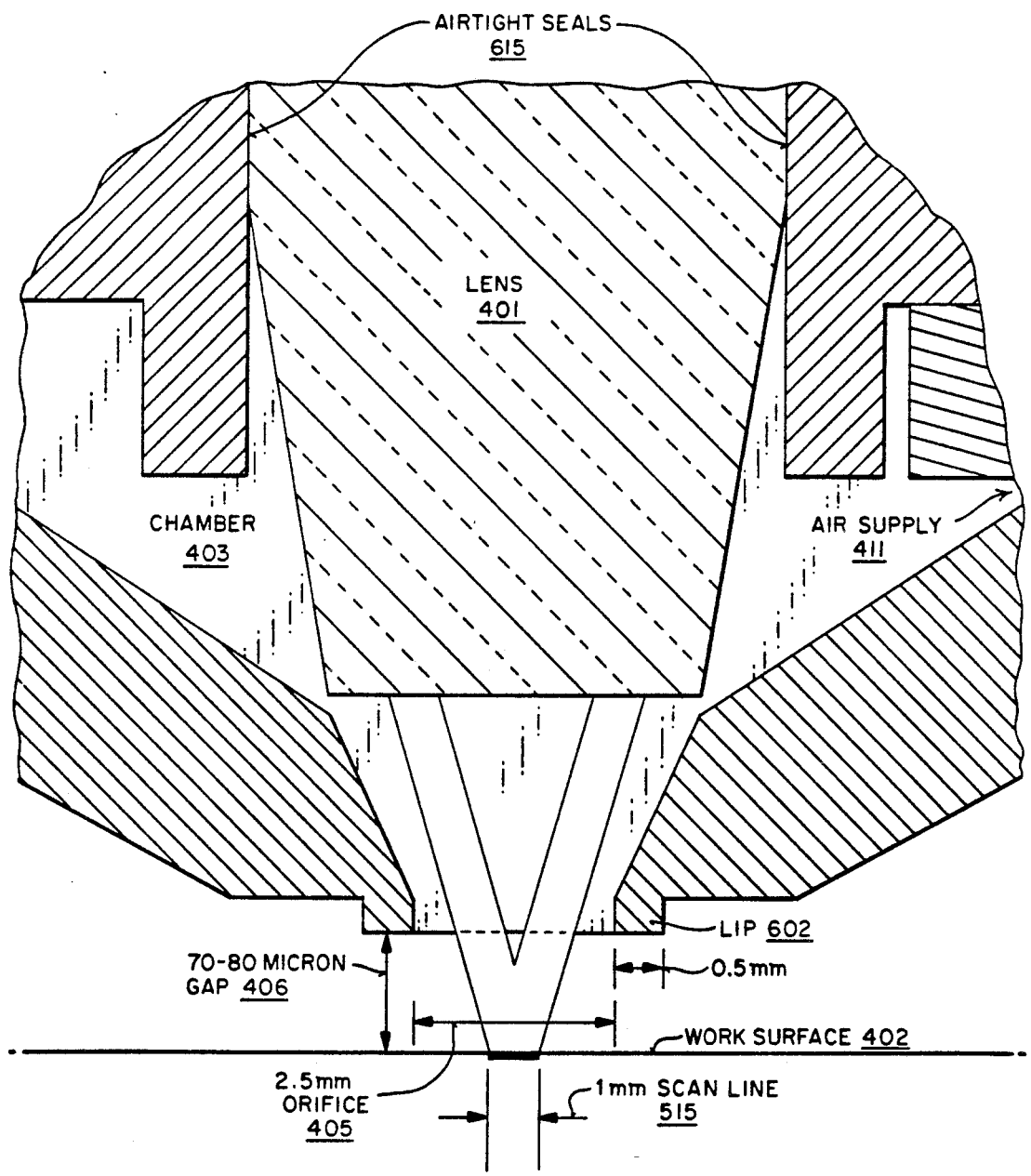
FIG. 6 is detailed cut-away view of the measurement orifice of the present invention.
Figure 7:
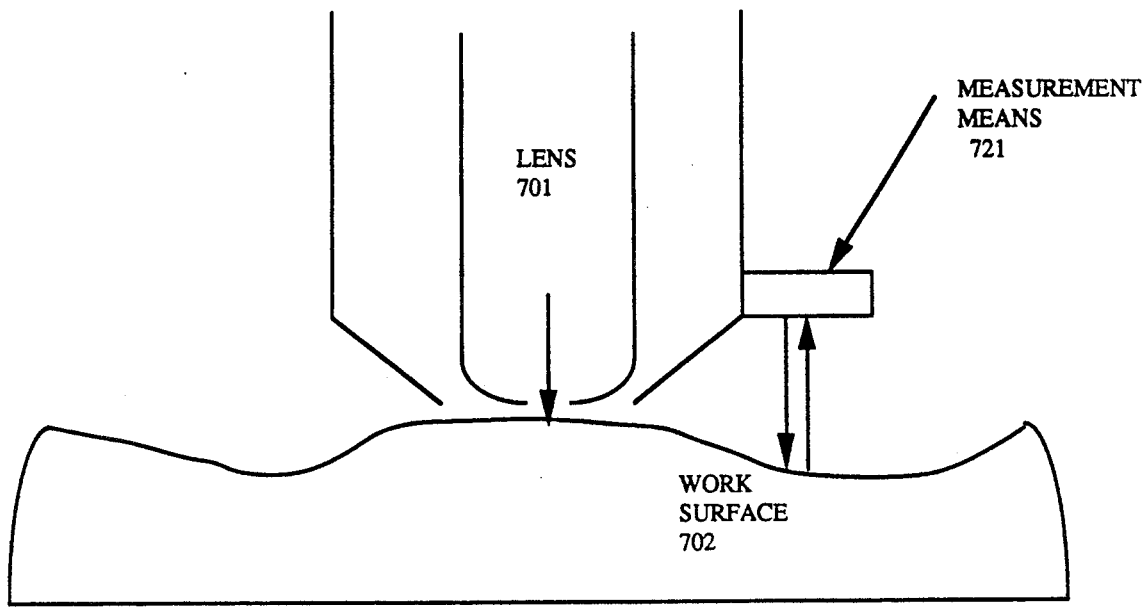
FIG. 7 is an illustration showing a non-uniform work surface as may be the subject of measurement by the device of the present invention.

Referring now to FIGS. 4, 5, and 6, illustrations of the nose piece of the preferred embodiment are shown in greater detail. In the preferred embodiment a light beam is directed through reduction lens 401 along light beam path 412 for writing to work surface 402. Lens 401 is coupled to nosepiece 404 to prevent air flow out of chamber 403 except through orifice 405. Air is supplied to chamber 403 through air supply tube 411. Through measurement of the air flow rate through orifice 405, the width of gap 406 may be determined (and the distance from lens 401 to work surface 402 is determined). Further details of the air supply 411 will be described with reference to FIG. 8.

As can be seen, a light beam is directed through lens 401 along light beam path 412 for writing scan line 515 on work surface 402. Lens 401 is preferably a 20× reduction lens and is mounted in the nosepiece to form airtight seals at points 615.

Thus, air may freely flow within chamber 403 (shown as a shaded portion in FIG. 6). In addition, air may flow out of chamber 403 through orifice 405. As will be seen, the gas (air) flow rate through orifice 405 may be measured to determine the width of gap 406. In the preferred system, orifice 405 measures approximately 2.5 mm and gap 406 is preferably maintained between 70 and 80 microns.

The supply of air from air supply 411 to the chamber 403 may be best described with reference to FIG. 5. The nosepiece preferably comprises a one-quarter inch magnetic stainless steel plate 513 which is ground on a magnetic or vacuum chuck to obtain a uniform bottom surface. As can be seen, a tube or other conduit is coupled to the steel plate to receive air from an air supply 411. An air passageway 507 is formed in the steel plate 513 by electrical discharge machining. A plug 512 is utilized to prevent air flow out of air passageway 507. Air is allowed to flow into chamber 403 at area 506.

The work surface 402 is preferably a photosensitive semiconductor wafer or the like. However, the present invention may find application in other devices. For example, the present invention may be utilized in microscope systems for measurement of distances from a microscope lens to a target surface. In general, the present invention may find application in any number of systems which require measurement of small gaps.

Again, by measuring the air flow rate from air supply 411 through air passageway 507 into chamber 403 and through orifice 405 and gap 406, the width of gap 406 may be determined. The lens 401 is in a fixed relationship with orifice 405 and, thus, the distance from lens 401 to work surface 402 is in a fixed relationship with the width of gap 406.

DESCRIPTION OF THE AIR SUPPLY AND FLOW MEASUREMENT APPARATUS OF THE PREFERRED EMBODIMENT

Figure 8:
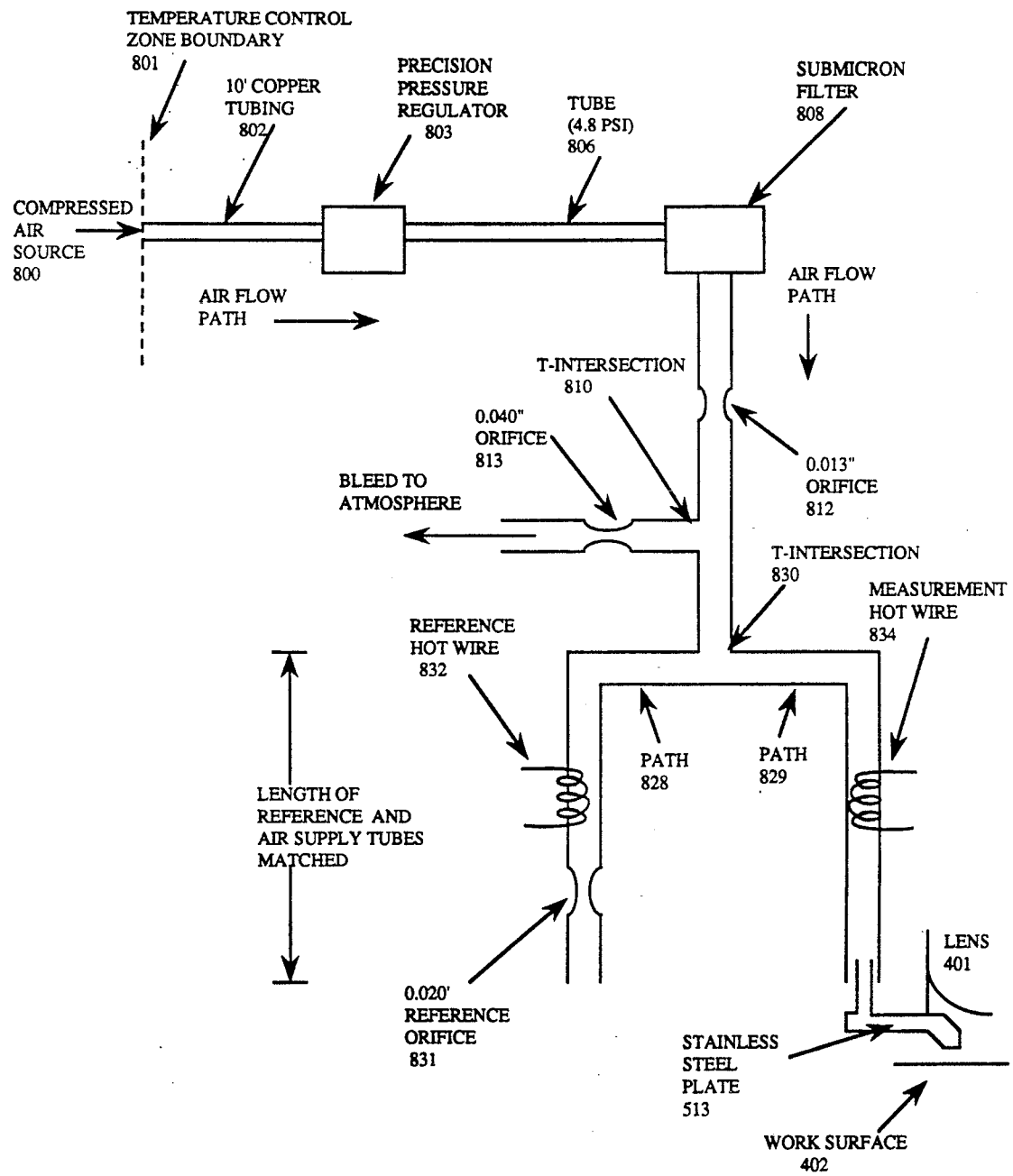
FIG. 8 is a block diagram of an air gage that may be utilized by the present invention.

Referring now to FIG. 8, the apparatus utilized by the preferred embodiment for supplying air to chamber 403 and for measurement of air flow is described. It should be noted that a number of alternative embodiments are available. What is important is that a device is employed for supplying a gas to chamber 403 and a device is employed for measurement of either the gas flow rate or for measurement of back pressure created from pressure against the work surface 402.

Preferably, a compressed air source 800 is utilized to supply air at approximately 50 pounds per square inch (PSI) to a length of tubing 802. The air flow rate into tubing 802 is approximately one and one-half liters per minute. In the preferred embodiment, tubing 802 is a copper tubing of approximately ten feet in length. Starting at point 801, the environment temperature is controlled within the air supply and measurement system of the preferred embodiment.

Tubing 802 is coupled to a precision pressure regulator 803. Regulator 803 regulates the air pressure and provides at an output air pressure at 4.8 PSI. Tubing 806 is coupled to the output of regulator 803.

A submicron filter 808 is supplied and coupled with tube 806 to filter out any unwanted particles. Submicron filter 808 may be any of a number of commercially available filters.

An first orifice 812 of a approximately 0.013 inches is supplied in tubing 806 to further resist air flow. In the air flow path, after orifice 812 a first t-intersection 810 is provided to allow a portion of the air flow to bleed to atmosphere through a second orifice 813. The second orifice 813 measures 0.040 inches in diameter. The result is pressure of approximately 0.8 inches of water in tube 806 after the first t-intersection 810.

After the first t-intersection in the air flow path, a second t-intersection 830 is provided to allow a first portion of the air flow to be bled to atmosphere along a first path 828 (the "reference path") and a second portion of the air flow to flow to the nosepiece as described in connection with FIGS. 4, 5 and 6 (the "air supply path").

The diameter, length and resistance (measured at the nominal operating point of the system) of the reference path and the air supply path are approximately equal; therefore, approximately an equal air flow rate occurs the reference path and the air supply path. A third orifice 831 (the "reference orifice") is provide to match the resistance of the reference path with the air supply path at the nominal operating point. In the preferred embodiment, the reference orifice has a diameter of approximately 0.020 inches.

As can be seen, the air supply path is coupled to stainless steel plate 513 to provide air flow as described above in connection with FIG. 5.

Measurement hot wire anemometer 834 comprising a thin wire resistance heated by electricity is provided in the air supply path. The resistance of measurement anemometer 834 is proportional to its temperature. In the system of the preferred embodiment, a constant flow of electricity is supplied to measurement anemometer 834; therefore, the resistance is determined by temperature and the temperature is a function of the gas flow rate over the measure anemometer wire 834. Further detail on the operation of a hot wire anemometer may be found with reference to the Wilson '401 patent. An identical anemometer shown as reference hot wire 832 is provided in the reference path. Thus, by measuring the resistance on measurement anemometer 834, the width of gap 406 may be determined.

Thus, an on-axis air-gage focus system for a semiconductor processing tool or the like has been described.

What is claimed is:

1. A focus system for focusing a beam onto a surface comprising:
    (a) a chamber for holding a lens, said chamber defining a orifice, said orifice located in a path between said lens and a workpiece;
    (b) supply means for supplying a fluid to said chamber; and
    (c) measurement means for measuring fluid flow from said supply means to said chamber to determine the distance between said lens and said workpiece.

2. The focus system as recited by claim 1 wherein said fluid is a gas.

3. The focus system as recited by claim 2 wherein said gas is air.

4. The focus system as recited by claim 1 wherein said measurement means comprises a hot-wire anemometer.

5. The focus system as recited by claim 1 further comprising a focus control system coupled to receive measurement information from said measurement means.

6. A focus system for focusing a beam onto a surface comprising:
    (a) a chamber for holding a lens, said chamber defining a orifice, said orifice located in a path between said lens and a workpiece;
    (b) supply means for supply a fluid to said chamber; and
    (c) measurement means for measuring back pressure of said fluid entering said chamber to determine the distance between said lens and said workpiece.

7. The focus system as recited by claim 6 wherein said fluid is a gas.

8. The focus system as recited by claim 7 wherein said gas is air.

9. The focus system as recited by claim 6 further comprising a focus control system coupled to receive measurement information from said measurement means.

10. In a photolithography system having means for generating an energy beam for writing a semiconductor substrate, a lens for focusing and reducing said energy beam and a part holder for holding said semiconductor substrate and means for determine the distance between said lens and said substrate, an improvement wherein said means for determining said distance comprises:
 (a) a chamber coupled with said lens, said chamber defining an orifice;
 (b) means for supplying a fluid to said chamber;
 (c) means for measuring a flow rate of said fluid into said chamber.

11. The photolithography system as recited by claim 10 wherein said fluid comprises a gas.

12. The photolithography system as recited by claim 11 wherein said gas is air.

13. The photolithography system as recited by claim 10 wherein said flow rate is proportional to said distance such that said distance may be determined with a range of approximately ±0.3 microns.

14. The photolithography system as recited by claim 11 wherein said measurement means comprises an anemometer for measuring said flow rate.

15. The photolithography system as recited by claim 10 further comprising a focus control means coupled to receive measurement information from said measurement means.

16. The photolithography system as recited by claim 10 wherein said energy beam comprises a light beam.

17. The photolithography system as recited by claim 16 wherein said lens comprises a reduction lens.

18. In a photolithography system having means for generating an energy beam for writing to a semiconductor substrate, a lens for focusing and reducing said energy beam and a part holder for holding said semiconductor substrate and means for determining the distance between said lens and said substrate, an improvement wherein said means for determining said distance comprises:
 (a) a chamber coupled with said lens, said chamber defining an orifice;
 (b) means for supplying a fluid to said chamber;
 (c) means for measuring back pressure of said fluid against said substrate.

19. The photolithography system as recited by claim 18 wherein said fluid comprises a gas.

20. The photolithography system as recited by claim 19 wherein said gas is air.

21. The photolithography system as recited by claim 18 wherein said means for measuring back pressure generates an electrical signal which corresponds to said distance such that said distance may be determined within a tolerance of approximately ±0.3 microns.

* * * * *

UNITED STATES PATENT AND TRADEMARK OFFICE
CERTIFICATE OF CORRECTION

PATENT NO. : 5,087,927
DATED : February 11, 1992
INVENTOR(S) : Tim Thomas, et. al.

It is certified that error appears in the above-indentified patent and that said Letters Patent is hereby corrected as shown below:

On the Title page, item [75], inventors: Change "Eugene Mino, Jr." to read --Eugene Mirro, Jr.-- Change "Bob Holstrom" to --Bob Holmstrom--.
On the Title page, item [73], Assignee: Change "Ateo Corporation" to read --Ateq Corporation--.

Signed and Sealed this

Thirtieth Day of August, 1994

Attest:

BRUCE LEHMAN

Attesting Officer

Commissioner of Patents and Trademarks